(12) United States Patent
Choi

(10) Patent No.: US 8,419,981 B2
(45) Date of Patent: Apr. 16, 2013

(54) CONDUCTIVE PASTE COMPOSITION AND ELECTRODE PREPARED USING THE SAME

(75) Inventor: Young Wook Choi, Uiwang-si (KR)

(73) Assignee: Cheil Industries, Inc., Gumi-si, Kyeongsangbuk-do (KR)

( * ) Notice: Subject to any disclaimer, the term of this patent is extended or adjusted under 35 U.S.C. 154(b) by 99 days.

(21) Appl. No.: 13/209,703

(22) Filed: Aug. 15, 2011

(65) Prior Publication Data

US 2012/0119153 A1    May 17, 2012

(30) Foreign Application Priority Data

Nov. 15, 2010 (KR) .................. 10-2010-0113515
Feb. 25, 2011 (KR) .................. 10-2011-0017418

(51) Int. Cl.
*H01B 1/22* (2006.01)
*H01L 31/0224* (2006.01)

(52) U.S. Cl.
USPC ........................................ 252/512; 252/514

(58) Field of Classification Search .......... 252/512–514; 338/322
See application file for complete search history.

(56) References Cited

U.S. PATENT DOCUMENTS

| | | | |
|---|---|---|---|
| 5,045,141 A * | 9/1991 | Salensky et al. ............... | 156/240 |
| 6,368,704 B1 | 4/2002 | Murata et al. | |
| 7,081,214 B2 | 7/2006 | Matsuba et al. | |
| 7,488,434 B2 * | 2/2009 | Kuo et al. ..................... | 252/512 |
| 2005/0194577 A1 | 9/2005 | Kasuga et al. | |
| 2005/0219789 A1 | 10/2005 | Akimoto et al. | |
| 2010/0196698 A1 * | 8/2010 | Trummer et al. ............. | 428/328 |

FOREIGN PATENT DOCUMENTS

| | | |
|---|---|---|
| EP | 0546560 A1 | 6/1993 |
| EP | 0916711 A2 | 5/1999 |
| EP | 1583107 A1 | 10/2005 |
| EP | 1586604 A1 | 10/2005 |
| KR | 10-2004-0030441 A | 4/2004 |

OTHER PUBLICATIONS

European Search Report in EP 11179655.3-2102, dated Apr. 24, 2012.

* cited by examiner

*Primary Examiner* — Mark Kopec
(74) *Attorney, Agent, or Firm* — Lee & Morse, P.C.

(57) ABSTRACT

A conductive paste composition and an electrode prepared using the same, the conductive paste composition including a conductive powder a binder resin; and a solvent, wherein the conductive powder includes a flake type powder having an average particle diameter (D50) of about 1.2 μm to about 3.0 μm, and a spherical powder having an average particle diameter (D50) of about 0.2 μm to about 2.0 μm, the flake type powder and the spherical powder are present in a weight ratio of about 1:0.4 to about 1:2, and the conductive powder and the binder resin are present in a weight ratio of about 1:0.04 to about 1:0.08.

18 Claims, No Drawings

CONDUCTIVE PASTE COMPOSITION AND ELECTRODE PREPARED USING THE SAME

BACKGROUND

1. Field

Embodiments relate to a conductive paste composition and an electrode prepared using the same.

2. Description of the Related Art

Heterojunction with intrinsic thin layer (HIT) solar cells and thin-film solar cells use transparent electrodes including indium tin oxide (ITO). These types of solar cells may undergo changes in their characteristics at high temperatures. Accordingly, electrode pastes having high electrical conductivity at low temperature have been developed.

An electrode of a fired solar cell may be formed after an antireflective layer is etched by a glass component present in a conductive paste and the silicon interface reacts with silver (Ag). In a HIT solar cell or a thin-film solar cell including a transparent conductive oxide (TCO) film, surface contact resistance of the TCO film may be influenced by optimum surface contact between the TCO film and a paste.

SUMMARY

Embodiments are directed to a conductive paste composition and an electrode prepared using the same.

The embodiments may be realized by providing a conductive paste composition including a conductive powder; a binder resin; and a solvent, wherein the conductive powder includes a flake type powder having an average particle diameter (D50) of about 1.2 μm to about 3.0 μm, and a spherical powder having an average particle diameter (D50) of about 0.2 μm to about 2.0 μm, the flake type powder and the spherical powder are present in a weight ratio of about 1:0.4 to about 1:2, and the conductive powder and the binder resin are present in a weight ratio of about 1:0.04 to about 1:0.08.

The flake type powder may have an average particle diameter (D50) of about 1.4 μm to about 2.8 μm.

The flake type powder may have a tap density of about 2.5 to about 5.0 g/cm$^3$.

The spherical powder may have an average particle diameter (D50) of about 0.4 μm to about 1.4 μm.

The flake type powder and the spherical powder may be present in a weight ratio of about 1:1 to 1:1.5.

The average particle diameter (D50) of the flake type powder may be greater than the average particle diameter (D50) of the spherical powder.

A ratio of the average particle diameter (D50) of the flake type powder to the average particle diameter (D50) of the spherical powder may be about 1.4:1 to about 2.4:1.

The conductive powder may be a mixture of the flake type powder and the spherical powder having different average particle diameters.

The conductive powder and the binder resin may be present in a weight ratio of about 1:0.05 to 1:0.07.

The flake type powder may have an average particle diameter (D50) of about 1.6 μm to about 2.7 μm, the spherical powder may have an average particle diameter (D50) about 0.5 μm to about 1.0 μm, the flake type powder and the spherical powder may be present in a weight ratio of about 1:1 to 1:1.5, and the conductive powder and the binder resin may be present in a weight ratio of about 1:0.06 to 1:0.07.

The conductive paste composition may include about 1 to about 10% by weight of the binder resin and about 80 to about 95% by weight of the conductive powder.

The solvent may be included in a balance amount.

The binder resin may be selected from the group of an epoxy resin, an acrylic resin, a (meth)acrylic resin, a cellulosic resin, an ester resin, an alkyd resin, a butyral resin, a PVA resin, and mixtures thereof.

The binder resin may include the epoxy resin, the epoxy resin being selected from the group of cresol novolac, bisphenol F, bisphenol A epoxy resins, and mixtures thereof.

The conductive paste composition may further include at least one of a diluent and a curing agent.

The embodiments may also be realized by providing an electrode prepared from the conductive paste composition according to an embodiment.

The electrode may have a contact resistance of about 5 mΩ·cm$^2$ to about 65 mΩ·cm$^2$.

The electrode may have a wire resistance of about 45 Ω/m to about 85 Ω/m.

DETAILED DESCRIPTION

Korean Patent Application No. 10-2010-0113515, filed on Nov. 15, 2010, and Korean Patent Application No. 10-2011-0017418 filed on Feb. 25, 2011, in the Korean Intellectual Property Office, and entitled: "Conductive Paste Composition and Electrode Including the Same," are incorporated by reference herein in their entirety.

Example embodiments will now be described more fully hereinafter; however, they may be embodied in different forms and should not be construed as limited to the embodiments set forth herein. Rather, these embodiments are provided so that this disclosure will be thorough and complete, and will fully convey the scope of the invention to those skilled in the art.

It will also be understood that when a layer or element is referred to as being "on" another layer or substrate, it can be directly on the other layer or substrate, or intervening layers may also be present.

An embodiment provides a conductive paste composition including a conductive powder, a binder resin, and a solvent. The conductive powder may include a flake type powder (having an average particle diameter (D50) of about 1.2 to about 3.0 μm) and a spherical powder (having an average particle diameter (D50) of about 0.2 to about 2.0 μm). The flake type powder and the spherical powder may be present in a weight ratio of about 1:0.4 to about 1:2. The conductive powder and the binder resin may be present in a weight ratio of about 1:0.04 to about 1:0.08.

Any suitable electrically conductive organic or inorganic material may be used for the conductive powder.

Examples of conductive powders suitable for use in the conductive paste composition may include silver (Ag), gold (Au), palladium (Pd), platinum (Pt), copper (Cu), chromium (Cr), cobalt (Co), aluminum (Al), tin (Sn), lead (Pb), zinc (Zn), iron (Fe), iridium (Ir), osmium (Os), rhodium (Rh), tungsten (W), molybdenum (Mo), and nickel (Ni) powders. These conductive powders may be used alone or as a mixture of two or more thereof. The conductive powder may be composed of an alloy of two or more metals selected from the group of silver (Ag), gold (Au), palladium (Pd), platinum (Pt), copper (Cu), chromium (Cr), cobalt (Co), aluminum (Al), tin (Sn), lead (Pb), zinc (Zn), iron (Fe), iridium (Ir), osmium (Os), rhodium (Rh), tungsten (W), molybdenum (Mo), and nickel (Ni). In an implementation, the conductive powder may include silver particles and may further include nickel (Ni), cobalt (Co), iron (Fe), zinc (Zn), and/or copper (Cu) particles.

The conductive powder may include a flake type powder and a spherical powder.

The flake type powder may be planar in the form of a flake or may have a flat shape. The flake type powder may be commercially available.

The flake type powder may have an average particle diameter (D50) of about 1.2 to about 3.0 µm, e.g., about 1.4 to about 2.8 µm or about 1.6 to about 2.7 µm. Maintaining the average particle diameter (D50) within the range may help ensure that a contact resistance of a final electrode (prepared using the composition) is effectively lowered.

The flake type powder may have an average particle diameter (D90) of about 4.0 to about 9.0 µm, e.g., about 4.5 to about 8.0 µm or about 6.0 to about 7.8 µm. The flake type powder may have an average particle diameter (D10) of about 0.5 to about 1.0 µm, e.g., about 0.7 to about 1.0 µm or about 0.6 to about 1.0 µm.

The average particle diameters of the powders may be determined using a particle size analyzer (CILAS 1064, CILAS Instruments).

The flake type powder may have a tap density of about 2.5 to about 5.0 g/cm$^3$, e.g., about 3.0 to about 4.6 g/cm$^3$ or about 4.0 to about 4.5 g/cm$^3$.

The flake type powder may have a specific surface area of about 0.5 to about 1.5 m$^2$/g, e.g., about 0.9 to about 1.3 m$^2$/g or about 0.9 to about 1.2 m$^2$/g.

The spherical powder may be composed of substantially spherical or elliptical particles. The spherical powder may be commercially available.

The spherical powder may have an average particle diameter (D50) of about 0.2 to about 2.0 µm, e.g., about 0.4 to about 1.4 µm or about 0.5 to about 1.0 µm. Maintaining the average particle diameter (D50) within the range may help ensure that the contact resistance of a final electrode (prepared using the composition) is effectively lowered.

The spherical powder may have an average particle diameter (D90) of about 0.5 to about 3.0 µm, e.g., about 0.6 to about 2.2 µm or about 1.3 to about 2.2 µm. The spherical powder may have an average particle diameter (D10) of about 0.2 to about 1.2 µm, e.g., about 0.2 to about 1.0 µm or about 0.2 to about 0.4 µm.

The spherical powder may have a tap density of about 4.0 to about 5.0 g/cm$^3$, e.g., about 4.3 to about 5.0 g/cm$^3$ or about 4.3 to about 4.8 g/cm$^3$.

The spherical powder may have a specific surface area of about 0.4 to about 1.4 m$^2$/g, e.g., about 0.6 to about 1.1 m$^2$/g or about 0.7 to about 1.1 m$^2$/g.

The conductive powder may include a mixture of flake type powders having different average particle diameters (D50, D90, or D10) or a mixture of spherical powders having different average particle diameters (D50, D90, or D10). In an implementation, the average particle diameters of the flake type powders may be about 1.6 to about 2.7 µm and those of the spherical powders may be about 0.4 to about 0.8 µm.

A ratio of the average particle diameter (D50) of the flake type powder to the average particle diameter (D50) of the spherical powder may be about 1.4:1 to about 2.4:1. Within this range, the contact resistance of a final electrode may be effectively lowered.

The flake type powder and the spherical powder may be present in a weight ratio of about 1:0.4 to about 1:2, e.g., about 1:0.5 to 1:1.5 or about 1:1 to 1:1.5. Including the flake type powder and the spherical powder within the range may help ensure that the contact resistance of an electrode formed using the composition is considerably lowered, compared to that of an electrode formed using a composition including only one of the flake type powder or the spherical powder.

The flake type powder may be present in an amount of about 35 to about 65 parts by weight, based on 100 parts by weight of the conductive powder. Maintaining the amount of the flake type powder at about 35 to about 65 parts by weight may help lower the contact resistance of a final electrode.

The spherical powder may be present in an amount of about 35 to about 65 parts by weight, based on 100 parts by weight of the conductive powder. Maintaining the amount of the spherical powder at about 35 to about 65 parts by weight may help lower the contact resistance of a final electrode.

The conductive powder may be present in an amount of about 80 to about 95% by weight, based on a total weight of the conductive paste composition. Maintaining the amount of the conductive powder at about 80 to about 95% by weight may help lower the contact resistance of a final electrode.

The binder resin may be added to provide liquid characteristics to the conductive paste composition.

The conductive powder and the binder resin may be present in a weight ratio of about 1:0.04 to about 1:0.08, e.g., about 1:0.05 to 1:0.07 or about 1:0.06 to 1:0.07. Within the range, the contact resistance of a final electrode may be effectively lowered.

The binder resin may be present in an amount of about 1 to about 10% by weight, e.g., about 3 to about 9% by weight, based on the total weight of the conductive paste composition. Maintaining the amount of the binder resin at about 1 to about 10% by weight may help considerably lower the contact resistance of a final electrode without causing reliability problems (e.g., electrode peeling).

The binder resin may have a weight average molecular weight of about 100 to about 1,000 g/mol, e.g., about 150 to about 500 g/mol.

Suitable binder resins may include, e.g., epoxy resins, (meth)acrylic resins, cellulosic resins, ester resins, alkyd resins, butyral resins, and PVA resins. For example, the binder resin may be an epoxy resin selected from the group of cresol novolac, bisphenol F, bisphenol A epoxy resins, and mixtures thereof.

The solvent may be any one that is capable of dissolving the binder resin and is miscible with the conductive powder and other additives. For example, the solvent may be one having a boiling point of about 200° C. or higher. Maintaining the boiling point at about 200° C. or greater may help ensure good printability, e.g., may reduce the likelihood of, or prevent, screen clogging. In an implementation, the solvent may be selected from the group of aliphatic alcohols, ester solvents, carbitol solvents, cellosolve solvents, and hydrocarbon solvents, which are commonly used in the production of electrodes. Examples of solvents suitable for use in the conductive paste composition include methyl cellosolve, ethyl cellosolve, butyl cellosolve, aliphatic alcohols, terpineol, ethylene glycol, ethylene glycol monobutyl ether, butyl cellosolve acetate, texanol, and butyl carbitol acetate. The solvent may make up the remainder or balance of the conductive paste composition. In an implementation, the solvent may be included in an amount of about 1 to about 10 parts by weight, e.g., about 2 to about 8 parts by weight, based on 100 parts by weight of the conductive paste composition.

In an implementation, the flake type powder may have an average particle diameter (D50) of about 1.4 to about 2.7 µm, the spherical powder may have an average particle diameter (D50) of about 0.4 to about 1.4 µm, the flake type powder and the spherical powder may be present in a weight ratio of about 1:1 to about 1:1.5, and the conductive powder and the binder resin may be present in a weight ratio of about 1:0.06 to about 1:0.07. These ranges may be effective in lowering the contact resistance of a final electrode (prepared using the composition).

In an implementation, the flake type powder may have an average particle diameter (D50) of about 1.6 to about 2.7 μm, the spherical powder may have an average particle diameter (D50) of about 0.4 to about 0.8 μm, the flake type powder and the spherical powder may be present in a weight ratio of about 1:1 to about 1:1.5, and the conductive powder and the binder resin may be present in a weight ratio of about 1:0.06 to about 1:0.07. These ranges may be effective in lowering the contact resistance of a final electrode.

The conductive paste composition may further include at least one diluent and/or at least one curing agent. For example, the conductive paste composition may further include at least one of a diluent and a curing agent.

Suitable diluents for use in the conductive paste composition may include, but are not limited to, epoxy compounds, such as epoxy (meth)acrylates. The diluent may be included in an amount of about 0.1 to about 5 parts by weight, e.g., about 0.5 to about 3 parts by weight, based on 100 parts by weight of the conductive paste composition. Maintaining the amount of the diluent at about 0.1 to about 5 parts by weight may help increase flexibility and reduce resistance of a final electrode (prepared using the composition).

Examples of curing agents suitable for use in the conductive paste composition may include amine curing agents, carboxyhydrazine, imidazole curing agents such as heptadecylimidazole, latent curing agents, and modified phenolic resins. The curing agent may be included in an amount of about 0.1 to about 5 parts by weight, e.g., about 0.2 to about 3 parts by weight, based on 100 parts by weight of the conductive paste composition.

The conductive paste composition may further include one or more additives selected from the group of glass frit, dispersants, thixotropic agents, viscosity stabilizers, defoaming agents, pigments, UV stabilizers, antioxidants, inorganic fillers, and coupling agents. Such additives are well known to those skilled in the art and may be commercially purchased.

The conductive paste composition may be used to form electrodes for various electrical/electronic devices. Other applications of the conductive paste composition may include packaging and assembly of electrical/electronic devices. In addition, the conductive paste composition may be suitable for the production of electrical/electronic device components by screen printing. As an example, the conductive paste composition may be used to form an electrode of a HIT solar cell or a thin-film solar cell in which low-temperature characteristics and low contact resistance are desirable.

The electrode may be formed by any suitable process known to those skilled in the art. For example, the electrode may be formed by printing the conductive paste composition followed by curing. The curing temperature may be about 100 to about 250° C., but is not limited to this range. The electrode may have a contact resistance of about 5 to about 65 mΩ·cm², e.g., about 7 to about 20 mΩ·cm². The electrode may have a wire resistance of about 45 to about 85 Ω/m.

The following Examples and Comparative Examples are provided in order to set forth particular details of one or more embodiments. However, it will be understood that the embodiments are not limited to the particular details described. Further, the Comparative Examples are set forth to highlight certain characteristics of certain embodiments, and are not to be construed as either limiting the scope of the invention as exemplified in the Examples or as necessarily being outside the scope of the invention in every respect.

Examples

Components used in Examples 1-3 and 5-15 and Comparative Examples 1-5 are as follows.

(1) Conductive powders: flake type Ag powders and spherical Ag powders whose physical properties are shown in Table 1.

TABLE 1

| Kind | Shape | Tap density (g/cm³) | Average particle diameter (D10, μm) | Average particle diameter (D50, μm) | Average particle diameter (D90, μm) | Specific surface area (m²/g) | Manufacturer | Grade |
|---|---|---|---|---|---|---|---|---|
| powder 1 | Spherical | 4.0 | 0.2 | 0.4 | 0.6 | 1.4 | Heesung Metal Co., Ltd. (Korea) | HP0704 |
| powder 2 | Spherical | 4.3 | 0.4 | 0.8 | 1.3 | 1.1 | Dowa | 2-1C |
| powder 3 | Spherical | 5.0 | 1.0 | 1.4 | 2.2 | 0.7 | Dowa | 3-11F |
| powder 4 | Spherical | 4.8 | 1.2 | 1.8 | 2.8 | 0.6 | Dowa | 4-11F |
| powder 5 | Spherical | 4.8 | 1.6 | 2.8 | 4.3 | 0.4 | Dowa | 5-11F |
| powder 6 | Flake | 2.5 | 0.7 | 1.6 | 4.1 | 4.6 | Dowa | S-2 |
| powder 7 | Flake | 5.0 | 0.6 | 1.4 | 5.6 | 1.2 | Dowa | S-1 |
| powder 8 | Flake | 3.3 | 1.0 | 2.7 | 7.36 | 1.3 | Heesung Metal Co., Ltd. (Korea) | HP0202E |
| powder 9 | Flake | 3.9 | 0.9 | 3.0 | 7.76 | 0.9 | Technic | F241 |
| powder 10 | Flake | 4.6 | 1.9 | 3.9 | 9.3 | 0.5 | Dowa | D-1 |

(2) Binder resin: A mixture of a cresol novolac resin (YDCN-90P, Kukdo Chemical Co., Ltd. (Korea)) ("Epoxy resin 1") and a bisphenol F resin (YDF-170, Kukdo Chemical Co., Ltd. (Korea)) ("Epoxy resin 2")

(3) Diluent: An epoxy acrylate resin (EA-5521, Shin-Nakamura Chemical Co., Ltd.)

(4) Solvent: Butyl carbitol acetate (BCA)

(5) Curing agent: 2-Undecylimidazole (C11Z, SHIKOKU Chemical)

Conductive paste compositions were prepared as shown in Tables 2-5. Each of the conductive paste compositions was rolled using a scraper on a screen plate and was then printed while being ejected using a squeezer to an image area of the screen plate, followed by curing at 200° C. for 40 min to form an electrode. The electrode was patterned to have a size of 1 cm (length)×200 μm (width); and the contact resistance and the wire resistance of the pattern were measured. The results are shown in Tables 2-5.

* Contact Resistance Measurement:

10 resistance values of the pattern were measured at intervals of 0.03 cm between 0.03 cm and 0.3 cm. The resistance values were plotted. From the graph, the slope, $R_c$ and $L_T$ values were obtained. A specific contact resistance ($\rho_c$) of the electrode was given by substituting the obtained values into the following equation.

$$\rho_c = R_c \times L_T \times Z \times \text{TAN } H(L/L_T)$$

where L and Z represent the area and length of the electrode, respectively.

* Wire Resistance Measurement:

The electrode was patterned to have a width of 100 μm and a length of 10 cm. The resistance of the pattern was measured using a multimeter. The obtained value was converted into a value per 1 meter length.

TABLE 2

| Conductive paste composition | Flake type powder 3 | Flake type powder 4 | Spherical powder 2 | Epoxy resin 1 | Epoxy resin 2 | Diluent | Curing agent | Solvent | Weight ratio* | Contact resistance (mΩ·cm²) | Wire resistance (Ω/m) |
|---|---|---|---|---|---|---|---|---|---|---|---|
| Example 1 | 22.2 | 22.2 | 44.6 | 1.4 | 4.8 | 1.5 | 0.3 | 3 | 1:0.0697 | 30.03 | 60.83 |
| Example 2 | 22.5 | 22.5 | 45 | 1.4 | 3.8 | 1.5 | 0.3 | 3 | 1:0.0578 | 18.02 | 49.17 |
| Example 3 | 22.8 | 22.8 | 45.4 | 1.4 | 2.8 | 1.5 | 0.3 | 3 | 1:0.0462 | 15.23 | 43 |
| Comparative Example 1 | 21.9 | 21.9 | 44.2 | 1.4 | 5.8 | 1.5 | 0.3 | 3 | 1:0.0818 | 48.38 | 72.92 |

*represents the weight ratio of the conductive powder to the sum of epoxy resins 1 and 2.

As may be seen from the results in Table 2, the conductive paste compositions of Examples 1-3 (each including the conductive powder and the binder resin in a weight ratio according to an embodiment) were effective in considerably reducing the contact resistance values of the respective electrodes.

TABLE 3

| Conductive paste composition | Flake type powder | | Spherical powder | | Epoxy resin 1 | Epoxy resin 2 | Diluent | Curing agent | Solvent | Contact resistance (mΩcm²) | Wire resistance (Ω/m) |
|---|---|---|---|---|---|---|---|---|---|---|---|
| | Size (D50, μm) | Content | Size (D50, μm) | Content | | | | | | | |
| Example 5 | 2.7 | 54 | 0.8 | 36 | 1.4 | 3.8 | 1.5 | 0.3 | 3 | 5.53 | 49.25 |
| Example 6 | 1.4 | 54 | 0.8 | 36 | 1.4 | 3.8 | 1.5 | 0.3 | 3 | 2.57 | 55.18 |
| Example 7 | 1.6 | 54 | 0.8 | 36 | 1.4 | 3.8 | 1.5 | 0.3 | 3 | 1.52 | 70.14 |
| Comparative Example 2 | 3.9 | 54 | 0.8 | 36 | 1.4 | 3.8 | 1.5 | 0.3 | 3 | 32.32 | 55.15 |

The results in Table 3 show that the conductive paste compositions of Examples 5-7 (each including the flake type powder having a size according to an embodiment) were effective in considerably reducing the contact resistance values of the respective electrodes.

TABLE 4

| Conductive paste composition | Flake type powder | | Spherical powder | | Epoxy resin 1 | Epoxy resin 2 | Diluent | Curing agent | Solvent | Contact resistance (mΩcm²) | Wire resistance (Ω/m) |
|---|---|---|---|---|---|---|---|---|---|---|---|
| | Size (D50, μm) | Content | Size (D50, μm) | Content | | | | | | | |
| Example 8 | 2.7 | 54 | 1.8 | 36 | 1.4 | 3.8 | 1.5 | 0.3 | 3 | 64.88 | 49.50 |
| Example 9 | 2.7 | 54 | 1.4 | 36 | 1.4 | 3.8 | 1.5 | 0.3 | 3 | 15.61 | 52.20 |
| Example 10 | 2.7 | 54 | 0.8 | 36 | 1.4 | 3.8 | 1.5 | 0.3 | 3 | 5.53 | 49.25 |
| Example 11 | 2.7 | 54 | 0.4 | 36 | 1.4 | 3.8 | 1.5 | 0.3 | 3 | 1.94 | 80.1 |
| Comparative Example 3 | 2.7 | 54 | 2.8 | 36 | 1.4 | 3.8 | 1.5 | 0.3 | 3 | 74.16 | 47.35 |

The results in Table 4 show that the conductive paste compositions of Examples 8-11 (each including the spherical powder having a size according to an embodiment) were effective in considerably reducing the contact resistance values of the respective electrodes.

TABLE 5

| Paste | Flake type powder Size (D50, μm) | Content | Spherical powder Size (D50, μm) | Content | Epoxy resin 1 | Epoxy resin 2 | Diluent | Curing agent | Solvent | Weight ratio* | Contact resistance (mΩcm$^2$) | Wire resistance (Ω/m) |
|---|---|---|---|---|---|---|---|---|---|---|---|---|
| Example 12 | 2.7 | 63 | 0.8 | 27 | 1.4 | 3.8 | 1.5 | 0.3 | 3 | 1:0.43 | 15.45 | 47.08 |
| Example 13 | 2.7 | 54 | 0.8 | 36 | 1.4 | 3.8 | 1.5 | 0.3 | 3 | 1:0.67 | 5.53 | 49.25 |
| Example 14 | 2.7 | 45 | 0.8 | 45 | 1.4 | 3.8 | 1.5 | 0.3 | 3 | 1:1 | 2.75 | 54.17 |
| Example 15 | 2.7 | 36 | 0.8 | 54 | 1.4 | 3.8 | 1.5 | 0.3 | 3 | 1:1.5 | 9.64 | 82.08 |
| Comparative Example 4 | 2.7 | 90 | 0.8 | 0 | 1.4 | 3.8 | 1.5 | 0.3 | 3 | — | Impossible to prepare pastes | |
| Comparative Example 5 | 2.7 | 0 | 0.8 | 90 | 1.4 | 3.8 | 1.5 | 0.3 | 3 | — | 1.0 | 148.2 |

*represents the weight ratio of the flake type powder to the spherical powder.

The results in Table 5 show that the conductive paste compositions of Examples 12-15 (each including the flake type powder and the spherical powder in a weight ratio according to an embodiment) were effective in considerably reducing the contact resistance values of the respective electrodes.

The embodiments provide a conductive paste composition that can be used to form a low temperature-type electrode having high electrical conductivity and low contact resistance to a transparent electrode.

By way of summation and review, low contact resistance and low wire resistance may be two important factors in improving the performance of the solar cell electrode. Low contact resistance may help efficiently transfer electron-hole pairs inside the solar cell to a finger electrode; and low wire resistance may help deliver electricity from the finger electrode to a bus bar electrode without any loss. Under such circumstances, electrode pastes with low wire resistance and low contact resistance may increase the efficiency of HIT solar cells and thin-film solar cells including TCO films as well as fired solar cells.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A conductive paste composition, comprising:
   a conductive powder;
   a binder resin; and
   a solvent, wherein:
   the conductive powder includes:
      a flake type powder having an average particle diameter (D50) of about 1.2 μm to about 3.0 μm, and
      a spherical powder having an average particle diameter (D50) of about 0.2 μm to about 2.0 μm,
   the flake type powder and the spherical powder are present in a weight ratio of about 1:0.4 to about 1:2, and
   the conductive powder and the binder resin are present in a weight ratio of about 1:0.04 to about 1:0.08.

2. The conductive paste composition as claimed in claim 1, wherein the flake type powder has an average particle diameter (D50) of about 1.4 μm to about 2.8 μm.

3. The conductive paste composition as claimed in claim 1, wherein the flake type powder has a tap density of about 2.5 to about 5.0 g/cm$^3$.

4. The conductive paste composition as claimed in claim 1, wherein the spherical powder has an average particle diameter (D50) of about 0.4 μm to about 1.4 μm.

5. The conductive paste composition as claimed in claim 1, wherein the flake type powder and the spherical powder are present in a weight ratio of about 1:1 to 1:1.5.

6. The conductive paste composition as claimed in claim 1, wherein the average particle diameter (D50) of the flake type powder is greater than the average particle diameter (D50) of the spherical powder.

7. The conductive paste composition as claimed in claim 6, wherein a ratio of the average particle diameter (D50) of the flake type powder to the average particle diameter (D50) of the spherical powder is about 1.4:1 to about 2.4:1.

8. The conductive paste composition as claimed in claim 1, wherein the conductive powder is a mixture of the flake type powder and the spherical powder having different average particle diameters.

9. The conductive paste composition as claimed in claim 1, wherein the conductive powder and the binder resin are present in a weight ratio of about 1:0.05 to 1:0.07.

10. The conductive paste composition as claimed in claim 1, wherein:
   the flake type powder has an average particle diameter (D50) of about 1.6 μm to about 2.7 μm,
   the spherical powder has an average particle diameter (D50) of about 0.5 μm to about 1.0 μm,
   the flake type powder and the spherical powder are present in a weight ratio of about 1:1 to 1:1.5, and
   the conductive powder and the binder resin are present in a weight ratio of about 1:0.06 to 1:0.07.

11. The conductive paste composition as claimed in claim 1, wherein the conductive paste composition includes about 1 to about 10% by weight of the binder resin and about 80 to about 95% by weight of the conductive powder.

12. The conductive paste composition as claimed in claim 11, wherein the solvent is included in a balance amount.

13. The conductive paste composition as claimed in claim 1, wherein the binder resin is selected from the group of an epoxy resin, an acrylic resin, a (meth)acrylic resin, a cellulosic resin, an ester resin, an alkyd resin, a butyral resin, a PVA resin, and mixtures thereof.

14. The conductive paste composition as claimed in claim 13, wherein the binder resin includes the epoxy resin, the epoxy resin being selected from the group of cresol novolac, bisphenol F, bisphenol A epoxy resins, and mixtures thereof.

15. The conductive paste composition as claimed in claim 1, further comprising at least one of a diluent and a curing agent.

16. An electrode prepared from the conductive paste composition as claimed in claim 1.

17. The electrode as claimed in claim 16, wherein the electrode has a contact resistance of about 5 m$\Omega \cdot cm^2$ to about 65 m$\Omega \cdot cm^2$.

18. The electrode as claimed in claim 16, wherein the electrode has a wire resistance of about 45 $\Omega$/m to about 85 $\Omega$/m.

\* \* \* \* \*